(12) United States Patent
Harazono et al.

(10) Patent No.: US 8,735,741 B2
(45) Date of Patent: May 27, 2014

(54) CIRCUIT BOARD AND MOUNTING STRUCTURE USING THE SAME

(75) Inventors: Masaaki Harazono, Yasu (JP); Yoshihiro Hosoi, Yasu (JP)

(73) Assignee: Kyocera Corporation, Kyoto (JP)

(*) Notice: Subject to any disclaimer, the term of this patent is extended or adjusted under 35 U.S.C. 154(b) by 403 days.

(21) Appl. No.: 13/301,152

(22) Filed: Nov. 21, 2011

(65) Prior Publication Data
US 2012/0132462 A1    May 31, 2012

(30) Foreign Application Priority Data

Nov. 29, 2010 (JP) .................... 2010-264529
Oct. 26, 2011 (JP) .................... 2011-234504

(51) Int. Cl.
*H05H 1/11* (2006.01)
*H05K 1/03* (2006.01)

(52) U.S. Cl.
CPC .................. *H05K 1/0366* (2013.01)
USPC ............ 174/264; 174/262; 174/266; 174/261

(58) Field of Classification Search
CPC ................ H05K 1/0366; H05K 3/42–3/429
USPC ........................................... 174/264
See application file for complete search history.

(56) References Cited

U.S. PATENT DOCUMENTS

| | | | |
|---|---|---|---|
| 2,897,409 A * | 7/1959 | Gitto | 174/257 |
| 2007/0074904 A1* | 4/2007 | Kohara et al. | 174/262 |
| 2008/0047742 A1* | 2/2008 | Samejima et al. | 174/257 |
| 2008/0164057 A1* | 7/2008 | Mori et al. | 174/262 |
| 2010/0254098 A1* | 10/2010 | Tsukada et al. | 361/748 |

* cited by examiner

*Primary Examiner* — Tuan T Dinh
*Assistant Examiner* — Steven T Sawyer
(74) *Attorney, Agent, or Firm* — Volpe and Koenig, P.C.

(57) ABSTRACT

A circuit board comprises a substrate; a through hole penetrating the substrate along with a direction of a thickness thereof; and a through hole conductor covering an inner wall of the through hole. The substrate comprises a first fiber layer, a second fiber layer, and a resin layer arranged between the first fiber layer and the second fiber layer. Each of the first fiber layer and the second fiber layer has a plurality of fibers and a resin arranged among the plurality of the fibers. The resin layer contains a resin and doesn't contain a fiber. The inner wall of the through hole, in a cross-section view along with the direction of the thickness of the substrate, comprises a curved depression in the resin layer.

7 Claims, 3 Drawing Sheets

US 8,735,741 B2

CIRCUIT BOARD AND MOUNTING STRUCTURE USING THE SAME

CROSS REFERENCES TO RELATED APPLICATIONS

The present invention contains subject matter related to Japanese Patent Application No. 2010-264529 filed in the Japan Patent Office on Nov. 29, 2010 and Japanese Patent Application No. 2011-234504 filed in the Japan Patent Office on Oct. 26, 2011, the entire contents of which are incorporated herein by reference.

FIELD OF THE INVENTION

The present invention relates to a circuit board used in, for example, an electronic device such as an audiovisual device, a household electrical appliance, a communication device, or a computer device or a peripheral device thereof, and a mounting structure using the circuit board.

Hitherto, structures produced by mounting an electronic component on a circuit board have been used as mounting structures in electronic devices.

DESCRIPTION OF THE RELATED ART

Japanese Unexamined Patent Application Publication No. 5-235544 discloses a circuit board including an insulating layer containing an insulating aggregate and a resin composition, a through hole penetrating the insulating layer in a direction of the thickness of the insulating layer, and a conductor layer formed in the through hole, in which a portion of the insulating aggregate projects from an inner wall of the through hole.

When an electric field is applied between adjacent through holes, a conductive material contained in the conductor layer of one of the through holes is ionized by moisture contained in the insulating layer, and the ionized conductive material may enter the insulating layer toward the conductor layer of the adjacent through hole (ion migration).

In particular, in the case where a portion of the insulating aggregate projects from an inner wall of the through hole, the insulating aggregate and the resin composition are easily separated from each other by a thermal stress generated when heat is applied to the circuit board during mounting or operation of an electronic component. Since moisture is easily accumulated in this separated portion, the ionized conductive material described above tends to expand in the separated portion.

As a result, when the conductive material reaches the conductor layer of the adjacent through hole, the conductor layers of the adjacent through holes are short-circuited, and electrical reliability of the circuit board tends to degrade.

BRIEF SUMMARY OF THE INVENTION

Embodiments of the invention provide a circuit board that meets the requirement for improving electrical reliability, and a mounting structure using the circuit board.

According to one embodiment of the invention, a circuit board comprises a substrate; a through hole penetrating the substrate along with a direction of a thickness thereof; and a through hole conductor covering an inner wall of the through hole.

The substrate comprises a first fiber layer, a second fiber layer, and a resin layer arranged between the first fiber layer and the second fiber layer. Each of the first fiber layer and the second fiber layer has a plurality of fibers and a resin arranged among the plurality of the fibers. The resin layer contains a resin and doesn't contain a fiber.

The inner wall of the through hole, in a cross-section view along with the direction of the thickness of the substrate, comprises a curved depression in the resin layer. The curved depression comprises one end at a boundary between the resin layer and the first fiber layer and other end at a boundary between the resin layer and the second fiber layer. A portion of the through hole conductor is arranged in the curved depression.

According to another embodiment of the invention, a mounting structure comprises the circuit board; and an electronic component mounted on the circuit board and electrically connected to the through hole conductor.

DETAILED DESCRIPTION OF EXEMPLARY EMBODIMENTS

A mounting structure including a circuit board according to an embodiment of the invention will now be described with reference to the accompanying drawings.

Figure 1A:
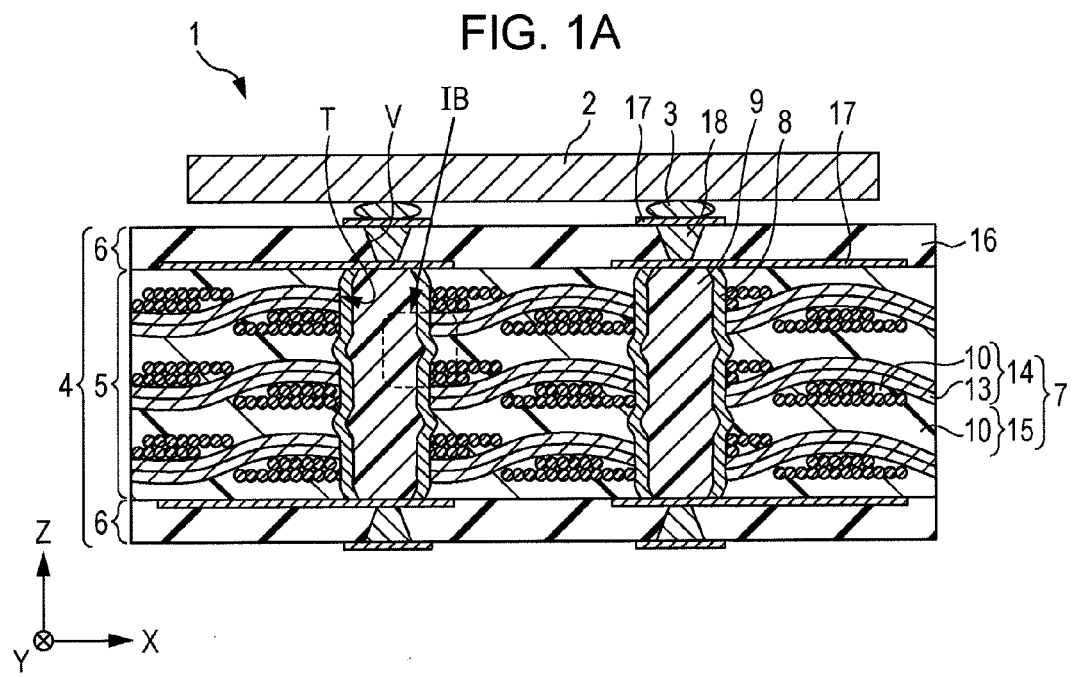
FIG. 1A is a cross-sectional view of a mounting structure according to an embodiment of the invention, the mounting structure being cut in the thickness direction thereof.

A mounting structure 1 illustrated in FIG. 1A is used in an electronic device such as an audiovisual device, a household electrical appliance, a communication device, or a computer device or a peripheral device thereof. The mounting structure 1 includes an electronic component 2 and a plate-shaped circuit board 4 on which the electronic component 2 is flip-chip mounted with bumps 3 therebetween.

The electronic component 2 is, for example, a semiconductor device such as an integrated circuit (IC) or a large-scale integrated circuit (LSI). The base material of the electronic component 2 is a semiconductor material such as silicon, germanium, gallium arsenide, gallium arsenide phosphide, gallium nitride, or silicon carbide. The thickness of the electronic component 2 is set to, for example, 0.1 mm or more and 1 mm or less.

The bumps 3 are composed of a conductive material such as solder containing, for example, lead, tin, silver, gold, copper, zinc, bismuth, indium, or aluminum.

The circuit board 4 includes a plate-shaped core board 5 and a pair of wiring layers 6 formed on both sides of the core board 5. For example, a coefficient of thermal expansion of the circuit board 4 in a planar direction is set to be larger than that of the electronic component 2.

The core board 5 is a component that electrically connects the pair of wiring layers 6 to each other while increasing the strength of the circuit board 4. The core board 5 includes a plate-shaped substrate 7 including a plurality of through holes T penetrating the substrate 7 in the thickness direction thereof, cylindrical through hole conductors 8 covering inner walls of the through holes T, and columnar insulators 9 each formed in a region surrounded by the corresponding through hole conductor 8.

Figure 1B:
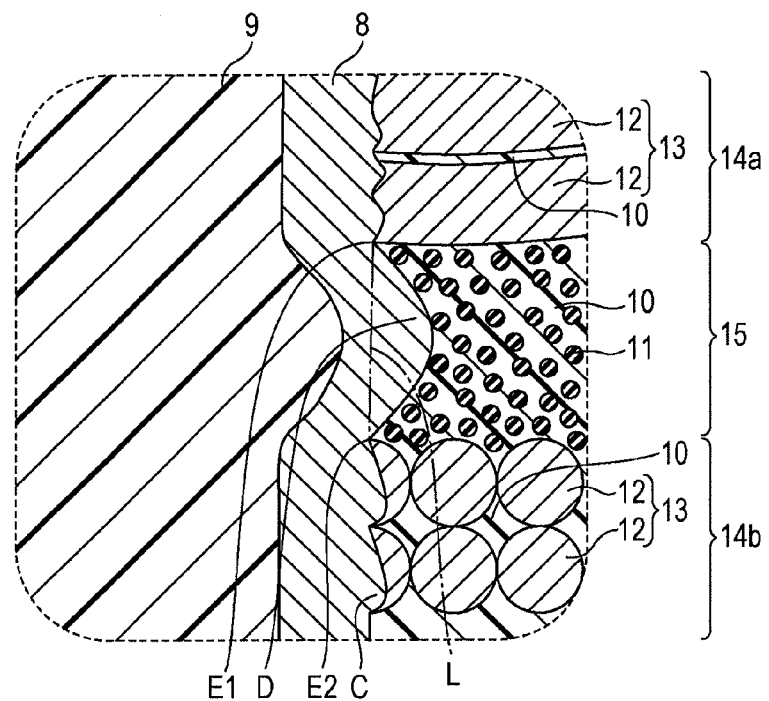
FIG. 1B is an enlarged view of portion 1B of FIG. 1A.

The substrate 7 is a component that increases the rigidity of the core board 5. As illustrated in FIGS. 1A and 1B, the substrate 7 includes a resin 10, inorganic insulating particles 11 covered with the resin 10, and a plate-shaped base 13 composed of a plurality of fibers 12 and covered with the resin 10.

In this substrate 7, a layer including the base 13 and the resin 10 arranged among the fibers 12 of the base 13 is defined as a fiber layer 14. For the sake of convenience, two adjacent fiber layers 14 are defined as a first fiber layer 14a and a second fiber layer 14b. A layer that is disposed between the fiber layers 14, that contains the resin 10 and the inorganic insulating particles 11, and that contains no fiber is defined as a resin layer 15. A boundary between the fiber layer 14 and the resin layer 15 is formed by a boundary between fibers 12 of the fiber layer 14 and the resin 10 of the resin layer 15. Note that the fiber layer 14 may contain the inorganic insulating particles 11 among the fibers 12.

The thickness of the substrate 7 is set to, for example, 0.03 mm or more and 0.4 mm or less. A coefficient of thermal expansion of the substrate 7 in a planar direction is, for example, 4 ppm/° C. or more and 15 ppm/° C. or less. A coefficient of thermal expansion of the substrate 7 in the thickness direction is set to, for example, 11 ppm/° C. or more and 30 ppm/° C. or less. The coefficient of thermal expansion of the substrate 7 in the thickness direction is set to, for example, two times or more and 2.8 times or less the coefficient of thermal expansion of the substrate 7 in the planar direction. The Young's modulus of the substrate 7 is set to, for example, 20 GPa or more and 30 GPa or less.

The coefficient of thermal expansion of the substrate 7 is measured using a commercially available thermomechanical analysis (TMA) apparatus by a method in accordance with JIS K7197-1991. The Young's modulus is measured using a Nano Indenter XP/DCM manufactured by MTS Systems Corporation.

Examples of the resin 10 contained in the substrate 7 include resin materials such as epoxy resins, bismaleimide-triazine resins, cyanate resins, polyparaphenylene benzobisoxazole resins, wholly aromatic polyamide resins, polyimide resins, aromatic liquid crystal polyester resins, polyether ether ketone resins, and polyether ketone resins. Coefficients of thermal expansion of the resin 10 in a planar direction and in the thickness direction are each set to, for example, 20 ppm/° C. or more and 50 ppm/° C. or less. The Young's modulus of the resin 10 is set to, for example, 3 GPa or more and 10 GPa or less.

The inorganic insulating particles 11 covered with the resin 10 are a component that decreases the coefficients of thermal expansion of the substrate 7 and that increases the rigidity of the substrate 7. The inorganic insulating particles 11 contain an inorganic insulating material such as aluminum hydroxide, magnesium hydroxide, or silicon oxide. Among these, silicon oxide, which has characteristics such as a coefficient of thermal expansion and a Young's modulus close to those of glass fibers, is preferably contained in the inorganic insulating particles 11. As a result, the coefficients of thermal expansion and the Young's modulus of the resin layer 15 can be made close to those of the fiber layer 14. In the case where the inorganic insulating particles 11 contain silicon oxide, the inorganic insulating particles 11 preferably contain silicon oxide in an amount of 65% by weight or more and 100% by weight or less. The inorganic insulating particles 11 may contain, for example, aluminum oxide, magnesium oxide, calcium oxide, aluminum nitride, aluminum hydroxide, or calcium carbonate in addition to silicon oxide.

The inorganic insulating particles 11 are formed so as to have, for example, a spherical shape, and the particle diameter thereof is set to, for example, 0.5 µm or more and 5.0 µm or less. A coefficient of thermal expansion of the inorganic insulating particles 11 in each direction is set to, for example, 2.7 ppm/° C. or more and 6 ppm/° C. or less. The Young's modulus of the inorganic insulating particles 11 is set to 70 GPa or more and 85 GPa or less. Particles obtained by finely cutting fibers may also be used as the inorganic insulating particles 11.

The content of the inorganic insulating particles 11 in the resin layer 15 is preferably set to 40% by volume or more and 75% by volume or less. By controlling the content of the inorganic insulating particles 11 to be 40% by volume or more, the coefficients of thermal expansion and the Young's modulus of the resin layer 15 can be made close to those of the fiber layer 14. By controlling the content of the inorganic insulating particles 11 to be 75% by volume or less, the adhesive strength between the inorganic insulating particles 11 and the resin 10 located on the inner wall of each of the through holes T is increased to suppress the separation of the inorganic insulating particles 11 from the resin 10, and furthermore, the separation of the through hole conductor 8 from the resin layer 15 can be suppressed.

Herein, the particle diameter of the inorganic insulating particles 11 is measured by observing a cross section of the substrate 7 with a field emission-type electron microscope to measure the maximum diameters of respective particles, and calculating the average of the maximum diameters. The content (% by volume) of the inorganic insulating particles 11 in the resin layer 15 is measured by observing a cross section of the resin layer 15 with a field emission-type electron microscope to measure the area ratio (area %) of the inorganic insulating particles 11 to the resin layer 15, and calculating the average of the area ratios. The average is defined as the content (% by volume).

The base 13 covered with the resin 10 is a component that increases the rigidity of the substrate 7 and that decreases the coefficient of thermal expansion of the substrate 7 in the planar direction. For example, a woven fabric in which a plurality of fibers 12 are woven in the vertical direction and in the horizontal direction can be used as the base 13. Alternatively, a nonwoven fabric may be used as the base 13. Alternatively, it is also possible to use a material in which a plurality of fibers 12 are arranged so as to be parallel to each other with respect to the longitudinal direction.

Glass fibers such as T-glass or E-glass fibers can be used as the fibers 12 contained in the base 13. The diameter of a cross section of each of the fibers 12 perpendicular to the longitudinal direction is set to, for example, 4 µm or more and 9 µm or less. Coefficients of thermal expansion of the fiber 12 in the longitudinal direction and in the width direction are each set to 2.5 ppm/° C. or more and 6 ppm/° C. or less. The Young's modulus of the fiber 12 is set to 70 GPa or more and 85 GPa or less.

Each of the through hole conductors 8 adhering to the inner wall of the corresponding through hole T is a component that electrically connects the wiring layers 6 to each other, the wiring layers 6 being provided on the upper surface and the lower surface of the core board 5. For example, the through hole conductors 8 may be composed of a conductive material such as copper, aluminum, or nickel. Regarding each of the through hole conductors 8, the length from the inner wall of the through hole T to the insulator 9 is set to 3 µm or more and 20 μm or less. Coefficients of thermal expansion of the through hole conductor 8 in the penetrating direction and the width direction are each set to, for example, 16 ppm/° C. or more and 25 ppm/° C. or less. The Young's modulus of the through hole conductor 8 is set to, for example, 60 GPa or more and 210 GPa or less. The coefficients of thermal expansion and the Young's modulus of the through hole conductor 8 are measured as in the substrate 7.

The insulator 9 formed in a region surrounded by the through hole conductor 8 is a component that forms a support surface of a via-conductor 18 described below. The insulator 9 may be formed using a resin material such as a polyimide resin, an acrylic resin, an epoxy resin, a cyanate resin, a fluorocarbon resin, a silicone resin, a polyphenylene ether resin, or a bismaleimide-triazine resin.

As described above, the pair of wiring layers 6 is formed on both sides of the core board 5. Each of the wiring layers 6 includes an insulating layer 16 laminated on the substrate 7 and having via-holes V penetrating in the thickness direction of the insulating layer 16, conductive layers 17 formed on the substrate 7 and the insulating layer 16, and via-conductors 18 each formed in the corresponding via-hole V and electrically connected to the conductive layers 17.

The insulating layer 16 functions not only as a support member that supports the conductive layers 17 but also as an insulating member that prevents short-circuit between the conductive layers 17. The insulating layer 16 contains a resin and inorganic insulating particles covered with the resin. The thickness of the insulating layer 16 is set to, for example, 5 μm or more and 40 μm or less. Coefficients of thermal expansion of the insulating layer 16 in a planar direction and in the thickness direction are each set to, for example, 15 ppm/° C. or more and 45 ppm/° C. or less. The Young's modulus of the insulating layer 16 is set to, for example, 5 GPa or more and 40 GPa or less. The coefficients of thermal expansion and the Young's modulus of the insulating layer 16 are measured as in the substrate 7.

Examples of the resin contained in the insulating layer 16 include epoxy resins, bismaleimide-triazine resins, cyanate resins, polyparaphenylene benzobisoxazole resins, wholly aromatic polyamide resins, polyimide resins, aromatic liquid crystal polyester resins, polyether ether ketone resins, and polyether ketone resins.

The inorganic insulating particles contained in the insulating layer 16 may be the same as the inorganic insulating particles 11 contained in the substrate 7.

The conductive layers 17 are a component that functions as wiring for a ground, wiring for an electrical power supply, or wiring for a signal and may be composed of a metal material such as copper, silver, gold, aluminum, nickel, or chromium. The thickness of each of the conductive layers 17 is set to, for example, 3 μm or more and 20 μm or less. Coefficients of thermal expansion of the conductive layer 17 in a planar direction and in the thickness direction are each set to, for example, 5 ppm/° C. or more and 25 ppm/° C. or less. The Young's modulus of the conductive layer 17 is 50 GPa or more and 250 GPa or less.

Each of the via-conductors 18 is a component that connects the conductive layers 17 to each other, the conductive layers 17 being provided separate from each other in the thickness direction thereof. The via-conductor 18 is formed so that the width thereof tapers toward the core board 5. The via-conductor 18 may be composed of a conductive material such as copper, silver, gold, aluminum, nickel, or chromium.

Since the substrate 7 includes the fiber layer 14 and the resin layer 15 that have different coefficients of thermal expansion, the coefficient of thermal expansion of the inner wall of each of the through holes T locally varies in the penetrating direction (Z direction) of the through hole T. Accordingly, when heat is applied to the circuit board 4 during mounting or operation of the electronic component 2, a thermal stress tends to be applied between the inner wall of the through hole T and the through hole conductor 8.

In the circuit board 4 of this embodiment, as illustrated in FIG. 1B, when the substrate 7 is viewed in a cross section in the thickness direction thereof, the inner wall of the through hole T has a curved depression D in the resin layer 15, and the depression D has an end E1 at a boundary between the resin layer 15 and the first fiber layer 14a, and another end E2 at a boundary between the resin layer 15 and the second fiber layer 14b. Furthermore, the inside of the depression D is filled with a portion of the through hole conductor 8.

Since the inside of the depression D is filled with a portion of the through hole conductor 8, an anchoring effect is generated in the penetrating direction of the through hole T. As a result, the adhesive strength between the inner wall of the through hole T and the through hole conductor 8 can be increased, the separation of the through hole conductor 8 from the inner wall of the through hole T can be suppressed, and furthermore, disconnection of the through hole conductor 8 can be suppressed.

Furthermore, the depression D has a curved line shape having the end E1 at the boundary between the resin layer 15 and the first fiber layer 14a, and the end E2 at the boundary between the resin layer 15 and the second fiber layer 14b. Therefore, the depression D can be formed while maintaining, at each of the boundaries, an area where the fiber 12 of the fiber layer 14 is covered with the resin 10 of the resin layer 15. Consequently, an area of a side face (surface parallel to the planar direction of the substrate 7) of the fiber 12 exposed to the inside of the depression D is reduced, thereby suppressing a separation between the fiber 12 and the resin 10, the separation starting from the exposed area. Thus, migration of the through hole conductor 8 is reduced to suppress short-circuit between adjacent through hole conductors 8. Furthermore, the circuit board 4 having good electrical reliability can be obtained.

The depression D is preferably set so that a depth from an imaginary line L connecting the end E1 to the end E2 is 1 μm or more and 5 μm or less. By controlling the depth to be 1 μm or more, the anchoring effect of the depression D can be increased. By controlling the depth to be 5 μm or less, exposure of the side face of the fiber 12 to the depression D can be decreased and separation between the fiber 12 and the resin 10 can be suppressed while increasing the insulating performance between through holes T that are adjacent to each other at the bottom of their depressions D.

The end E1 of the depression D is preferably located at an edge of the first fiber layer 14a and the end E2 of the depression D is preferably located at an edge of the second fiber layer 14b. As a result, a side face of a fiber 12 located at a boundary between the resin layer 15 and the fiber layer 14 can be covered with the resin 10 of the resin layer 15 from the substrate 7 side to the through hole T side (in the X-Y plane direction). Thus, exposure of the side face of the fiber 12 to the inside of the depression D is avoided, and separation between the fiber 12 and the resin 10 can be suppressed.

Figure 2A:
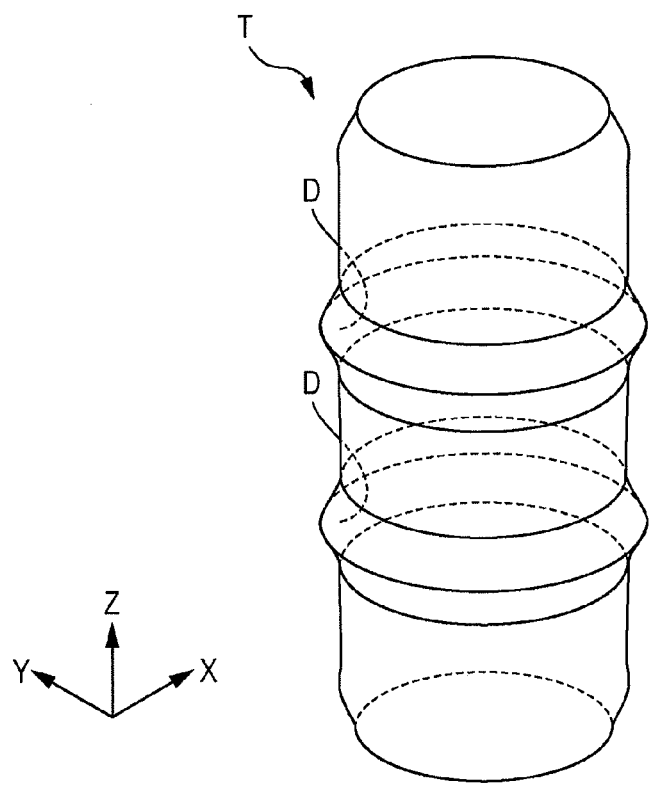
FIG. 2A is a perspective view illustrating the shape of a through hole of a mounting structure according to an embodiment of the invention.

As illustrated in FIG. 2A, the depression D is preferably formed over the circumferential direction of the through hole T. As a result, the anchoring effect in the penetrating direction (Z direction) of the through hole T can be increased.

In the circuit board 4 of this embodiment, as illustrated in FIG. 1B, a surface of each of the fibers 12 of the first fiber layer 14a and the second fiber layer 14b, the surface being exposed to the inner wall of the through hole T (surface parallel to the penetrating direction of the through hole T), has a concave portion C. Furthermore, the inside of the concave portion C is filled with a portion of the through hole conductor 8. As a result, an anchoring effect is also generated in the fibers 12, which are composed of glass fibers having a coefficient of thermal expansion smaller than that of the through hole conductor 8. Thus, the adhesive strength between the inner wall of the through hole T and the through hole conductor 8 can be increased.

A surface roughness (Ra) of a surface of the fiber 12, the surface being exposed to the inner wall of the through hole T, is set to, for example, 0.3 μm or more and 3 μm or less. An arithmetic mean roughness of a side face (surface parallel to the planar direction of the substrate 7) of the fiber 12, the side face being located at a boundary between the resin layer 15 and the fiber layer 14, is set to, for example, 0.1 μm or less, and is smaller than the arithmetic mean roughness of the surface of the fiber 12, the surface being exposed to the inner wall of the through hole T. Note that the surface roughness is an arithmetic mean deviation of the assessed profile in accordance with ISO4287:1997.

Figure 2B:
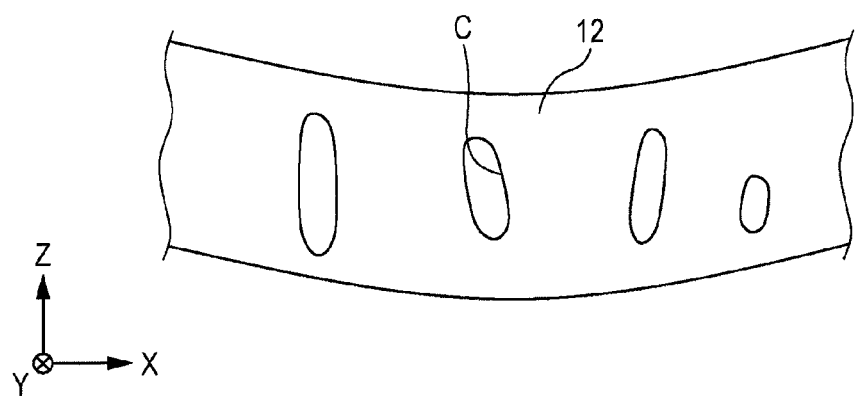
FIG. 2B is a view illustrating a surface of a fiber exposed to an inner wall of a through hole of a mounting structure according to an embodiment of the invention.

As illustrated in FIG. 2B, the concave portion C preferably has a long shape, which is a shape of a groove extending in the direction of the thickness of the substrate 7. As a result, in the fiber 12 having an amount of thermal expansion in plan view smaller than that of the through hole conductor 8, an anchoring effect is generated in the circumference direction of the through hole T. Thus, the adhesive strength between the inner wall of the through hole T and the through hole conductor 8 can be increased.

The length of the concave portion C in an extension direction is set to, for example, 3 μm or more and 8 μm or less. The width of the concave portion C is set to, for example, 2 μm or more and 5 μm or less. The depth of the concave portion C is set to, for example, 0.5 μm or more and 3 μm or less. In the concave portion C, the ratio of the width to the length in the extension direction is set to, for example, 40% or more and 80% or less.

Thus, a desired function of the above-described mounting structure 1 is achieved by driving or controlling the electronic component 2 on the basis of a power supply or a signal supplied through the circuit board 4.

Next, a method for producing the mounting structure 1 will be described with reference to FIGS. 3A to 3D.

Preparation of Substrate

Figure 3A:
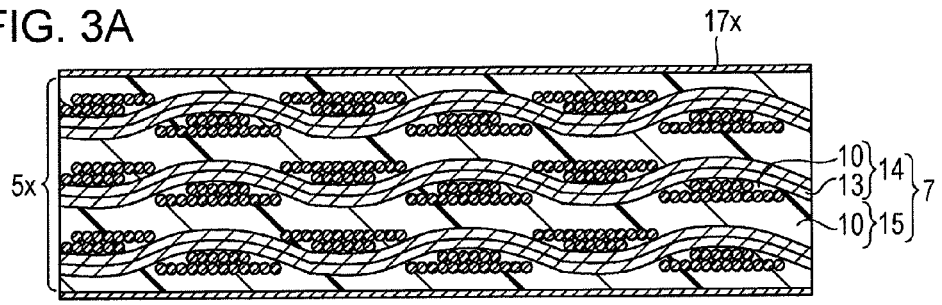
FIGS. 3A to 3D are cross-sectional views illustrating steps of producing the mounting structure illustrated in FIG. 1A, the mounting structure being cut in the thickness direction thereof.

As illustrated in FIG. 3A, a copper-clad laminate 5x including a substrate 7 and copper foils 17x disposed on the upper surface and the lower surface of the substrate 7 is prepared. Specifically, for example, the copper-clad laminate 5x is prepared as follows.

First, a varnish containing an uncured resin 10 and inorganic insulating particles 11 is prepared. A base 13 is impregnated with the varnish to form a resin sheet. When the base 13 is impregnated with the varnish in this manner, the inorganic insulating particles 11 do not easily enter between fibers 12 of the base 13, and thus are concentrated in an area (area to be formed into a resin layer 15) outside the base 13. Note that the uncured state is the state of A-stage or B-stage in accordance with ISO472:1999.

Next, the resin sheets thus prepared are laminated to form a substrate precursor. A copper foil 17x is laminated on each of the upper surface and the lower surface of the substrate precursor to form a laminate, and the laminate is then pressed in the thickness direction thereof under heating. Thus, the resin 10 is thermally cured, thus forming a substrate 7 and preparing the copper-clad laminate 5x described above. In forming the substrate 7 in this manner, the base 13 of a resin sheet and the resin 10 disposed among fibers 12 of the base 13 form a fiber layer 14, and areas of adjacent resin sheets, the areas being disposed outside the base 13, adhere to each other and form a resin layer 15.

Figure 3B:
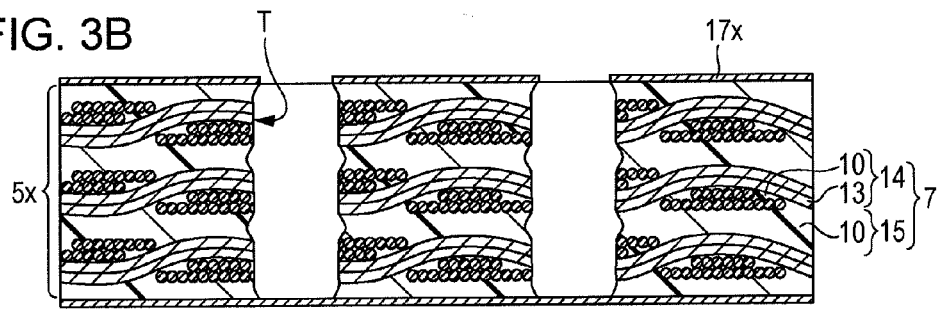

Formation of Through Hole (2) As illustrated in FIG. 3B, through holes T are formed in the copper-clad laminate 5x by sand blasting. Specifically, for example, the through holes T are formed as follows.

First, a resist having openings at positions where the through holes T are to be formed is formed on each of the upper main surface and the lower main surface of the copper-clad laminate 5x. This resist can be formed by, for example, exposure and development of a photosensitive resin. Next, fine particles are blasted from a nozzle of a sand blasting device onto a main surface of the copper-clad laminate 5x, thereby forming a portion of each of the through holes T (not penetrated) through the openings of the resist. Next, fine particles are blasted on another main surface of the copper-clad laminate 5x to form the through holes T penetrating the substrate 7. Note that the through holes T penetrating the substrate 7 may be formed by blasting fine particles on only one main surface of the copper-clad laminate 5x. Next, the resist is removed with, for example, a 1 wt % aqueous sodium hydroxide solution. Next, the inner walls of the through holes T are washed with high-pressure water to remove remaining fine particles and machining dust of the through holes T.

As described above, in the method for producing a circuit board 4 of this embodiment, the through holes T are formed in the substrate 7, which includes the fiber layers 14 and the resin layers 15, by sand blasting. In this method, since the fiber layers 14 of the substrate 7 include fibers 12 composed of glass, the fiber layers 14 are not easily cut by sand blasting, as compared with the resin layers 15. Therefore, when the blasted fine particles collide with each other and scatter, the fine particles cut the resin layers 15 toward the inside of the substrate 7 more significantly than the fiber layers 14. Thus, depressions D can be formed in the inner walls of the through holes T in the resin layers 15.

Furthermore, each of the depressions D is formed to have a curved shape in a cross section of the substrate 7 in the thickness direction of the substrate 7. The reason for this is believed to be as follows. When the substrate 7 is cut by sand blasting, a first fiber layer 14a right on a resin layer 15 projects to the through hole T side, and thus fine particles blasted from the sand blasting device easily reach the inside of the substrate 7 as the fine particles are away from the first fiber layer 14a, and the depressions D are easily deeply formed. On the other hand, a second fiber layer 14b right under the resin layer 15 projects to the through hole T side, and thus fine particles reflected at the bottom during cutting easily reach the inside of the substrate 7 as the fine particles are away from the second fiber layer 14b, and the depressions D are easily deeply formed. Thus, it is believed that the curved depressions D are formed in this manner.

In addition, a surface of a fiber 12, the surface being exposed to the inner wall of a through hole T, is partially cut by the fine particles blasted in the thickness direction of the substrate 7. Thus, a concave portion C having a shape of a groove extending in the thickness direction of the substrate 7 can be formed.

Furthermore, since a resist is used, a plurality of through holes T can be formed at the same time by blasting fine particles over a wide area. Thus, the through holes T can be efficiently formed, as compared with the case where drilling or laser beam machining is employed. In particular, when the thickness of the substrate 7 is set to be small; 0.03 mm or more and 0.4 mm or less, the through holes T can be efficiently formed by sand blasting.

Furthermore, since the through holes T are formed using fine particles, a stress and heat (frictional heat generated during drilling) applied to a boundary between a fiber 12 and a resin 10 can be reduced, as compared with the case where drilling is employed, and heat applied to a boundary between a fiber 12 and a resin 10 can be reduced, as compared with the case where laser beam machining is employed. Consequently, separation of the fiber 12 and the resin 10 can be suppressed.

In the case where the content of the inorganic insulating particles 11 in the substrate 7 is increased, the use of sand blasting is advantageous in that a drill is not worn unlike drilling, and that the through holes T can be easily formed, as compared with the case where laser beam machining is employed.

In order to form the through holes T and the depressions D by sand blasting as described above, the sand blasting may be performed under the conditions described below.

First, the sand blasting is performed by dry blasting. In dry blasting, since the resistance to fine particles is lower than that in wet blasting, the cutting efficiency of the through holes T can be increased, remaining of machining dust during cutting can be suppressed, and blocking of cutting caused by the machining dust can be suppressed.

Examples of the fine particles that can be used in the blasting include spherical particles and crushed particles composed of an inorganic insulating material such as alumina, glass, or silicon carbide. Among these, crushed particles composed of alumina or the like having a hardness higher than that of glass fibers are preferably used. As a result, a surface of the fiber 12, the surface being exposed to the inner wall of the through hole T, is partially cut by sharp edges of such hard crushed particles. Thus, the cutting efficiency of the through holes T can be increased, and the concave portion C can be satisfactorily formed. The crushed particles can be formed by, for example, crushing a structure composed of an inorganic insulating material.

The particle diameter of the fine particles is set to 10 μm or more and 30 μm or less. By controlling the particle diameter to be 10 μm or more, the cutting efficiency of the through holes T can be increased, the cutting efficiency of the resin layer 15 is also increased, and thus the depressions D can be satisfactorily formed. By controlling the particle diameter to be 30 μm or less, the amount of cutting of the fiber 12 with a single fine particle is appropriately decreased, and thus the depressions D can be satisfactorily formed. Note that the particle diameter of the fine particles is the average of the maximum diameters of respective particles.

The pressure at which the fine particles are blasted is set to 0.15 MPa or more and 0.22 MPa or less. By controlling the pressure to be 0.15 MPa or more, the cutting efficiency of the through holes T can be increased, and the fine particles collide with each other and scatter. Consequently, the resin layer 15 is significantly cut toward the inside of the substrate 7, and thus the depressions D can be satisfactorily formed. By controlling the pressure to be 0.22 MPa or less, the amount of cutting of the fiber 12 with a single fine particle is appropriately decreased, and thus the depressions D can be satisfactorily formed.

The number of times the fine particles are blasted onto a single through hole T (the number of times of scanning) is determined in accordance with the thickness of the substrate 7. For example, when the thickness of a core board 5 is 80 μm or more and 400 μm or less, the number of times is set to 4 or more and 20 or less.

The content of the inorganic insulating particles 11 in the resin layer 15 of the substrate 7 onto which fine particles are blasted is set to 40% by volume or more and 75% by volume or less. By controlling the content of the inorganic insulating particles 11 to be 40% by volume or more, the cutting efficiency of the resin layer 15 by sand blasting can be increased. Consequently, the cutting efficiency of the through holes T can be increased and the depressions D can be satisfactorily formed. By controlling the content of the inorganic insulating particles 11 to be 75% by volume or less, detachment of the inorganic insulating particles 11 can be suppressed, and the formation of a depression D having an excessively large depth can be suppressed.

By performing sand blasting under the above-described conditions, the through holes T and the depressions D can be satisfactorily formed.

In the step of (1) described above, the copper foil 17x is laminated on each of the upper main surface and the lower main surface of the substrate 7. Accordingly, the copper foil 17x is not easily cut by sand blasting, as compared with the fiber layer 14 and the resin layer 15. Therefore, the diameter of the opening of each of the through holes T can be made small by the presence of the copper foil 17x.

In this method, it is desirable that a desmear treatment be not performed on the inner walls of the through holes T formed by sand blasting. In the case where the through holes T are formed by sand blasting, heat applied to the inner walls of the through holes T can be reduced to reduce the amount of residue of carbonized resins, in addition, intermolecular bonds are physically cleaved, and thus a reaction activity in the inner walls of the through holes T can be increased, as compared with the case where the through holes T are formed by drilling or laser beam machining. Therefore, the adhesive strength between each of the through holes T and a corresponding through hole conductor 8 can be increased even without performing a desmear treatment. In the case where a desmear treatment is not performed, it is possible to suppress a phenomenon that only the resin 10 is selectively etched and a side face of the fiber 12 is significantly exposed, and therefore, separation between the resin 10 and the fiber 12 can be suppressed. Furthermore, in the case where a desmear treatment is not performed, the shapes of the depressions D can be maintained. Accordingly, in a step of (3) below, the inside of each depression D can be filled with a portion of the through hole conductor 8.

Figure 3C:
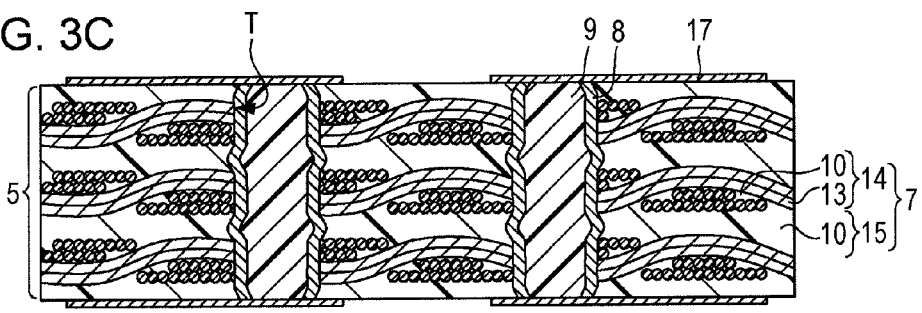

Formation of Through Hole Conductor (3) As illustrated in FIG. 3C, through hole conductors 8 and insulators 9 are formed in the substrate 7, and conductive layers 17 are further formed on the substrate 7. Thus, the core board 5 is prepared. Specifically, the through hole conductors 8, the insulators 9, and the conductive layers 17 are formed as follows, for example.

First, a conductive material is caused to adhere to the inner walls of the through holes T by electroless plating, electrolytic plating, vapor deposition, chemical vapor deposition (CVD), sputtering, or the like to form the cylindrical through hole conductors 8. In this step, the inside of each depression D on the inner wall of the through hole T is filled with the conductive material. Next, regions surrounded by the cylindrical through hole conductors 8 are filled with a resin material or the like to form the insulators 9. Next, a conductive material is caused to adhere to a portion where the insulator 9 is exposed. The copper foils 17x are then patterned by a known photolithographic technique, etching, and the like to form the conductive layers 17.

The core board 5 can be prepared as described above.

Figure 3D:
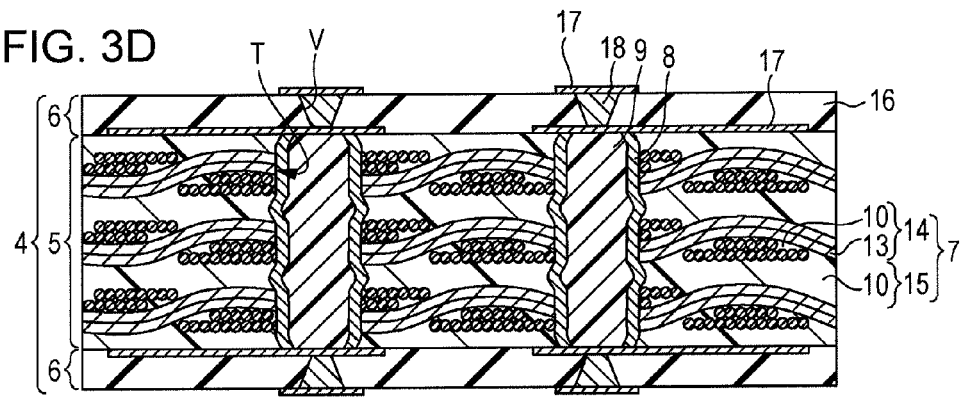

Formation of Wiring Layer (4) As illustrated in FIG. 3D, a pair of wiring layers 6 is formed on the upper surface and the lower surface of the core board 5 to prepare a circuit board 4. Specifically, the circuit board 4 is prepared as follows, for example.

First, an uncured resin is placed on the conductive layer 17. The resin is heated while being allowed to flow and being brought into close contact with the conductive layer 17, and is further heated to be cured. Thus, an insulating layer 16 is formed on the conductive layer 17. Next, via-holes V are formed by laser beam machining so that at least a portion of the conductive layer 17 is exposed in the corresponding via-hole V. By forming the via-holes V by laser beam machining in this manner, damage of the conductive layer 17 exposed in the via-hole V can be reduced, as compared with the case where sand blasting is employed. Next, a via-conductor 18 is formed in each of the via-holes V, and a conductive layer 17 is formed on the top surface of the insulating layer 16 by, for example, a semi-additive process, a subtractive process, or a full-additive process.

The circuit board 4 can be prepared as described above. Multilayered insulating layers 16 and conductive layers 17 can be formed in the wiring layer 6 by repeating the above-described step.

Mounting of Electronic Component (5) Bumps 3 are formed on the top surface of the conductive layer 17 functioning as a top layer, and an electronic component 2 is flip-chip mounted on the circuit board 4 with the bumps 3 therebetween.

Thus, the mounting structure 1 illustrated in FIG. 1A can be fabricated.

The invention is not limited to the above-described embodiments, and various modifications, improvements, and combinations can be made without departing from the gist of the invention.

For example, in the embodiments described above, a description has been made of, as an example, a structure in which a semiconductor device is used as an electronic component. Alternatively, a capacitor or the like may be used as the electronic component.

In the embodiments described above, a description has been made of, as an example, a structure in which an electronic component is flip-chip mounted on a circuit board. Alternatively, the electronic component may be mounted on the circuit board by wire bonding. Alternatively, the electronic component may be mounted inside the circuit board.

In the embodiments described above, a description has been made of, as an example, a structure in which a wiring layer includes one insulating layer. However, the number of insulating layers included in the wiring layer is not particularly limited.

In the embodiments described above, a description has been made of, as an example, a structure in which a substrate includes three fiber layers. However, the number of fiber layers included in the substrate is not particularly limited.

In the embodiments described above, a description has been made of, as an example, a structure in which a resin in a fiber layer is the same as a resin in a resin layer. Alternatively, the resin in the fiber layer may be different from the resin in the resin layer.

In the embodiments described above, a description has been made of, as an example, a structure in which a copper foil is used in the step of (1). Alternatively, a metal foil composed of a metal material such as an iron-nickel alloy or an iron-nickel-cobalt alloy may be used instead of the copper foil.

What is claimed is:

1. A circuit board, comprising:
a substrate;
a through hole penetrating the substrate along with a direction of a thickness thereof; and
a through hole conductor covering an inner wall of the through hole,
wherein the substrate comprises a first fiber layer, a second fiber layer, and a resin layer arranged between the first fiber layer and the second fiber layer,
each of the first fiber layer and the second fiber layer has a plurality of fibers and a resin arranged among the plurality of the fibers,
the resin layer contains a resin and doesn't contain a fiber,
the inner wall of the through hole, in a cross-section view along with the direction of the thickness of the substrate, comprises a curved depression in the resin layer,
the curved depression comprises one end at a boundary between the resin layer and the first fiber layer, and other end at a boundary between the resin layer and the second fiber layer, and
a portion of the through hole conductor is arranged in the curved depression.

2. The circuit board according to claim 1, wherein
a depth of the curved depression is 1 µm or more and 5 µm or less.

3. The circuit board according to claim 1, wherein
the one end of the curved depression is arranged at an edge of the first fiber layer, and
the other end of the curved depression is arranged at an edge of the second fiber layer.

4. The circuit board according to claim 1, wherein
at least one of the plurality of the fibers of the first fiber layer comprises a concave portion on a surface thereof exposed to the through hole, and
a portion of the through hole conductor is arranged in the concave portion.

5. A mounting structure, comprising:
the circuit board according to claim 1; and
an electronic component mounted on the circuit board and electrically connected to the through hole conductor.

6. The circuit board according to claim 4, wherein
a surface roughness (Ra) of the surface, which the at least one of the plurality of the fibers of the first fiber layer comprises, exposed to the through hole is 0.3 µm or more and 3 µm or less.

7. The circuit board according to claim 4, wherein
the concave portion has a shape of a groove along with the direction of the thickness of the substrate.

* * * * *